(12) United States Patent
Miyamoto

(10) Patent No.: US 7,558,098 B2
(45) Date of Patent: Jul. 7, 2009

(54) FERROELECTRIC MEMORY WITH SUB BIT-LINES CONNECTED TO EACH OTHER AND TO FIXED POTENTIALS

(76) Inventor: Hideaki Miyamoto, 310-20, Arakawa-cho, Ogaki-shi, Gifu (JP) 503-0993

( * ) Notice: Subject to any disclaimer, the term of this patent is extended or adjusted under 35 U.S.C. 154(b) by 50 days.

(21) Appl. No.: 11/739,754

(22) Filed: Apr. 25, 2007

(65) Prior Publication Data

US 2007/0253274 A1    Nov. 1, 2007

(30) Foreign Application Priority Data

Apr. 26, 2006  (JP)  ............................. 2006-121425

(51) Int. Cl.
    *G11C 5/06* (2006.01)
(52) U.S. Cl. ...................... 365/65; 365/49.12; 365/117; 365/145; 365/230.03; 365/189.15; 365/189.16; 365/205; 365/207
(58) Field of Classification Search ............. 365/49.12, 365/65, 117, 145, 230.03, 189.15, 189.16, 365/205, 207
See application file for complete search history.

(56) References Cited

U.S. PATENT DOCUMENTS

| | | | |
|---|---|---|---|
| 6,256,245 B1 | 7/2001 | Kwak | |
| 6,845,030 B2 * | 1/2005 | Kang et al. | 365/145 |
| 6,985,374 B2 | 1/2006 | Yamamura | |
| 7,110,279 B2 | 9/2006 | Miyamoto et al. | |
| 7,319,606 B2 * | 1/2008 | Miyamoto | 365/145 |
| 2005/0141258 A1 * | 6/2005 | Kang et al. | 365/145 |
| 2005/0207203 A1 * | 9/2005 | Kang | 365/145 |

FOREIGN PATENT DOCUMENTS

| | | |
|---|---|---|
| JP | 2001-222889 A | 8/2001 |
| JP | 2004-220740 | 8/2004 |
| JP | 2005-108397 | 4/2005 |
| JP | 2005-285190 | 10/2005 |
| JP | 2006-121425 | 5/2006 |

* cited by examiner

*Primary Examiner*—Huan Hoang
*Assistant Examiner*—Fernando N Hidalgo
(74) *Attorney, Agent, or Firm*—Schwabe, Williamson & Wyatt PC

(57) ABSTRACT

A memory capable of suppressing increase of a chip area thereof while preventing nonselected subarrays from disturbance is obtained. This memory comprises a first transistor for connecting respective sub bit lines with each other, and connects the sub bit lines of the nonselected subarrays with each other through the first transistor and connects the same to fixed potentials arranged on both ends of a memory cell array at least in a read operation.

16 Claims, 10 Drawing Sheets

FERROELECTRIC MEMORY WITH SUB BIT-LINES CONNECTED TO EACH OTHER AND TO FIXED POTENTIALS

BACKGROUND OF THE INVENTION

Field of the Invention

The present invention relates to a memory.

CROSS-REFERENCE TO RELATED APPLICATIONS

The priority application number JP2006-121425, Memory, Apr. 26, 2006, Hideaki Miyamoto, upon which this patent application is based is hereby incorporated by reference.

DESCRIPTION OF THE BACKGROUND ART

A ferroelectric memory comprising memory cells including ferroelectric capacitors is generally known as one of nonvolatile memories. Such ferroelectric memories include a one-transistor one-capacitor ferroelectric memory comprising memory cells each formed by one transistor and one ferroelectric capacitor, a one-transistor ferroelectric memory comprising memory cells each formed by one transistor having a ferroelectric capacitor and a crosspoint ferroelectric memory comprising memory cells each formed by only a ferroelectric capacitor arranged between a word line and a bit line. Each of the one-transistor ferroelectric memory and the crosspoint ferroelectric memory is constituted of a smaller number of elements as compared with the one-transistor one-capacitor ferroelectric memory, whereby the area per memory cell is reduced. Therefore, the chip area of the overall memory cell array can be reduced.

The one-transistor one-capacitor ferroelectric memory controls connection between bit lines and the ferroelectric capacitors through the transistors. Therefore, the parasitic capacitance of each bit line is the sum of the wiring capacitance thereof and the diffusion capacitance (junction capacitance) of the corresponding transistor. In the crosspoint ferroelectric memory, on the other hand, each ferroelectric capacitor is directly connected to the corresponding bit line, whereby the parasitic capacitance of the bit line is the sum of the wiring capacitance thereof and the capacitance of the ferroelectric capacitor. The dielectric constant of the ferroelectric capacitor is so high that the capacitance of the ferroelectric capacitor is greater than the diffusion capacitance (junction capacitance) of a transistor with respect to the same area. Therefore, the bit line parasitic capacitance in the crosspoint ferroelectric memory is greater than that in the one-transistor one-capacitor ferroelectric memory. Further, a read voltage output to the bit line in a read operation depends on the ratio (Cs/Cb) between a cell capacitance Cs and a bit line parasitic capacitance Cb. Therefore, the read voltage can be increased as the ratio Cs/Cb is increased. In other words, the read voltage can be more increased as the bit line parasitic capacitance Cb is reduced. However, the bit line parasitic capacitance in the crosspoint ferroelectric memory is greater than that in the one-transistor one-capacitor ferroelectric memory as hereinabove described, whereby the read voltage is disadvantageously reduced in the crosspoint ferroelectric memory.

A bit line hierarchical structure of bit lines divided into a main bit line and sub bit lines is also known in general. In this bit line hierarchical structure, a capacitance contributing to the bit line parasitic capacitance is limited to that of a ferroelectric capacitor forming a memory cell connected to the corresponding one of the divided sub bit lines. Thus, the value of the parasitic capacitance Cb of the overall bit lines is so reduced that the read voltage can be increased. In the bit line hierarchical structure, however, each nonselected sub bit line enters an electrically floating state, whereby noise is disadvantageously propagated to the sub bit line. Thus, the quantity of polarization of a ferroelectric capacitor linked to the nonselected sub bit line is deteriorated due to the voltage of the noise propagated to the sub bit line, to disadvantageously result in disappearance of data referred to as disturbance.

Therefore, generally proposed is a method of avoiding such disturbance caused in a ferroelectric capacitor linked to each nonselected sub bit line in a ferroelectric memory having the bit line hierarchical structure. According to this method, a common potential supply line (potential fixing line) is provided every two low blocks (subarrays) each including a sub bit line, while a transistor for connecting the corresponding sub bit line to the potential supply line is provided every sub bit line. The sub bit line connected to each nonselected low block (subarray) is connected to a fixed potential by turning on the transistor for connecting the sub bit line to the potential supply line (potential fixing line). Thus, the nonselected sub bit line can be prevented from entering a floating state.

According to this method, however, a potential supply line (potential fixing line) must be provided every two low blocks (subarrays), whereby the number of the potential supply lines (potential fixing lines) is disadvantageously increased if the number of the low blocks (subarrays) is increased. Therefore, the chip area of the ferroelectric memory is disadvantageously increased.

SUMMARY OF THE INVENTION

A memory according to an aspect of the present invention comprises a memory cell array including a plurality of subarrays, a word line arranged on the memory cell array, a main bit line arranged to intersect with the word line, sub bit lines arranged on the respective subarrays and provided to be connectable to the main bit line, a storage portion connected between the word line and the sub bit lines and a first transistor arranged between the respective sub bit lines for connecting the respective sub bit lines with each other, for connecting the sub bit lines of nonselected subarrays with each other through the first transistor and connecting the sub bit lines to fixed potentials arranged on both ends of the memory cell array in a read operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a crosspoint ferroelectric memory according to a first embodiment of the present invention is described with reference to FIGS. 1 to 4.

Figure 1:
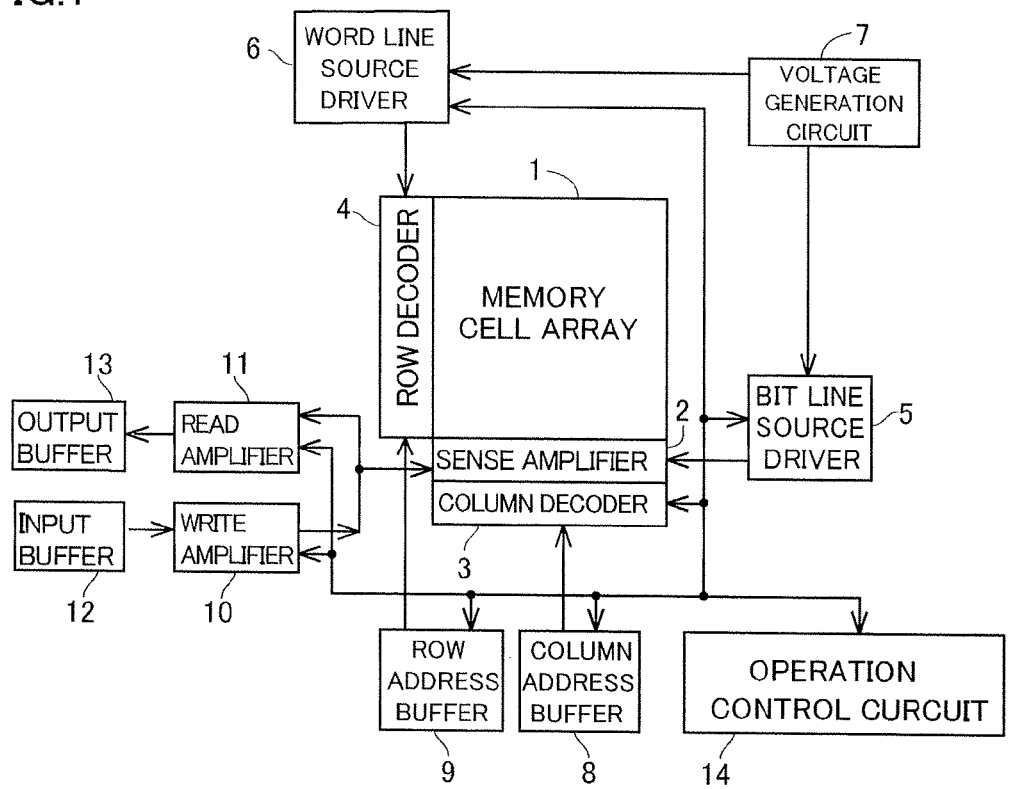
FIG. 1 is a block diagram for illustrating the overall structure of a crosspoint ferroelectric memory according to a first embodiment of the present invention.

As shown in FIG. 1, the crosspoint ferroelectric memory according to the first embodiment comprises a memory cell array 1, a sense amplifier 2, a column decoder 3, a row decoder 4, a bit line source driver 5, a word line source driver 6, a voltage generation circuit 7, a column address buffer 8, a row address buffer 9, a write amplifier 10, a read amplifier 11, an input buffer 12, an output buffer 13 and an operation control circuit 14.

The bit line source driver 5 and the word line source driver 6 are connected to the sense amplifier 2 and the row decoder 4 respectively. Further, the bit line source driver 5 and the word line source driver 6 are supplied with signals having prescribed potentials generated in the voltage generation circuit 7 respectively. The column address buffer 8 and the row address buffer 9 are connected to the column decoder 3 and the row decoder 4 respectively. The write amplifier 10 and the read amplifier 11 are connected to the sense amplifier 2, while the input buffer 12 and the output buffer 13 are connected to the write amplifier 10 and the read amplifier 11 respectively. The operation control circuit 14 is connected to the column decoder 3, the bit line source driver 5, the word line source driver 6, the column address buffer 8, the row address buffer 9, the write amplifier 10 and the read amplifier 11.

Figure 2:
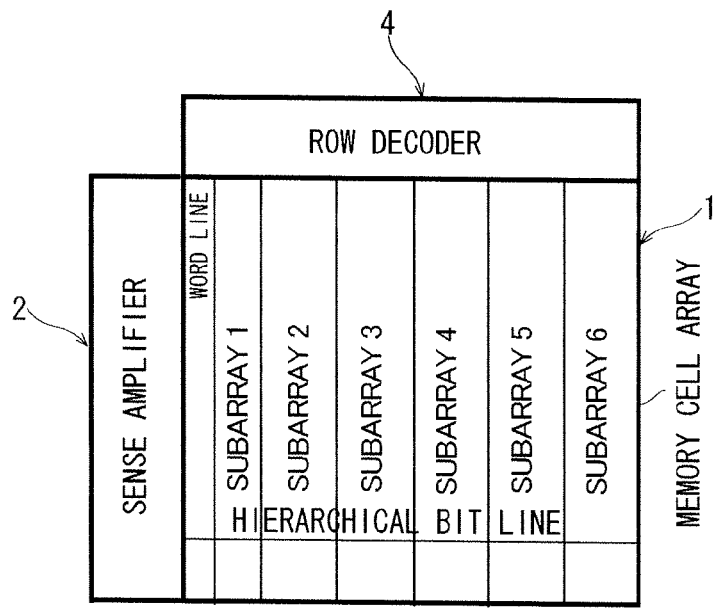
FIG. 2 is a schematic diagram showing the internal structure of a memory cell array of the crosspoint ferroelectric memory according to the first embodiment shown in FIG. 1.

The memory cell array 1 is divided into a plurality of subarrays, as shown in FIG. 2. According to the first embodiment, the memory cell array 1 is divided into six subarrays 1 to 6. A plurality of word lines WL and a plurality of hierarchical bit lines are arranged on the subarrays 1 to 6 to intersect with each other. The hierarchical bit lines are formed by a common main bit line and sub bit lines 1 to 6 arranged on the respective subarrays 1 to 6. The main bit line included in the hierarchical bit lines is connected to the column decoder 3 through the sense amplifier 2, while the word lines are connected to the row decoder 4.

Figure 3:
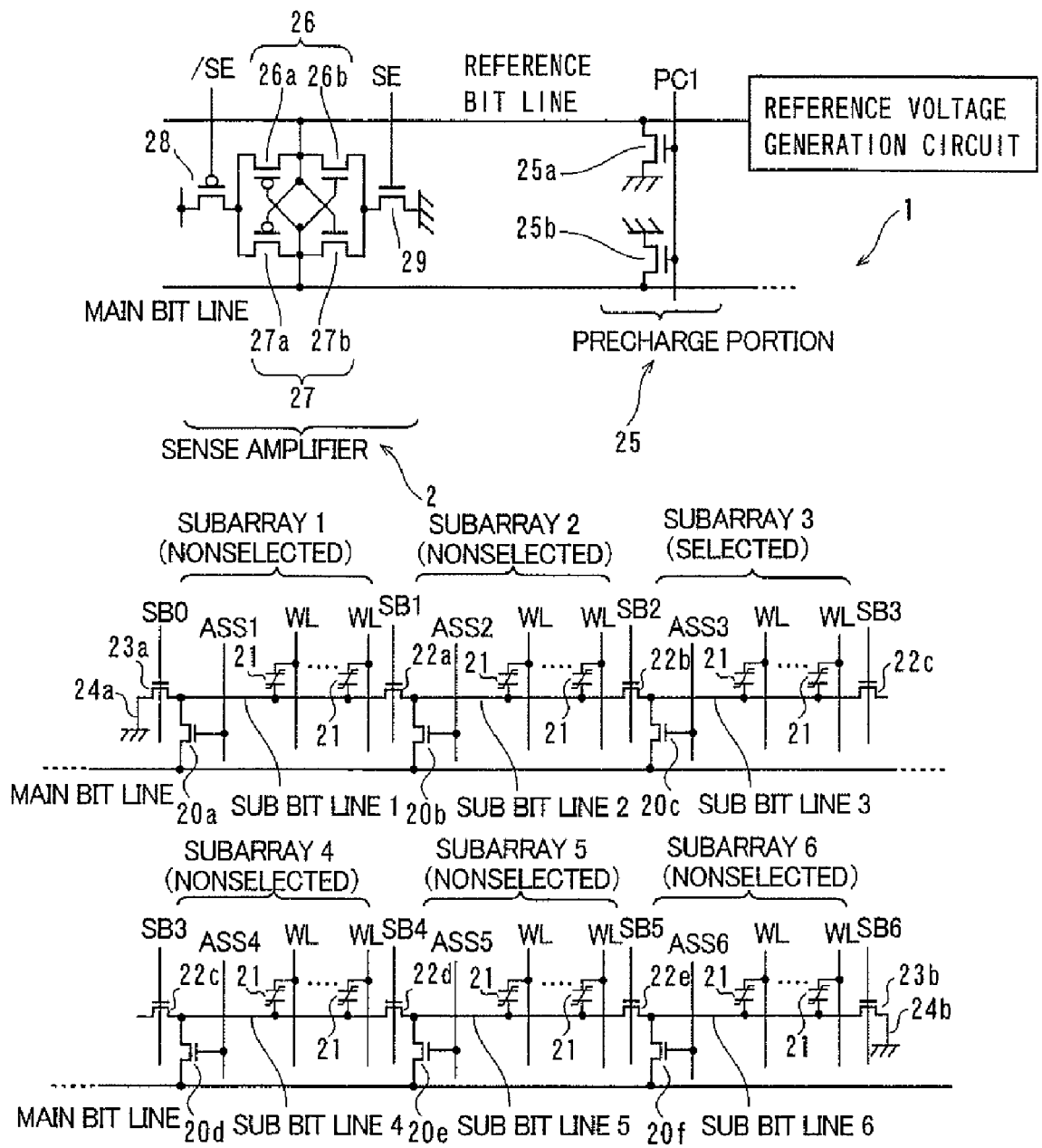
FIG. 3 is a circuit diagram detailedly showing the internal structure of the memory cell array of the crosspoint ferroelectric memory according to the first embodiment of the present invention.
Figure 4:
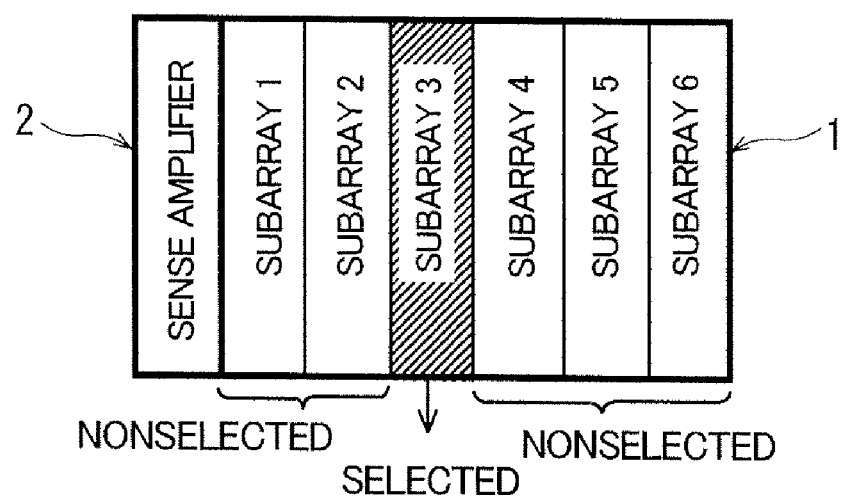
FIG. 4 is a schematic diagram showing selected and nonselected subarrays in the crosspoint ferroelectric memory according to the first embodiment of the present invention.

According to the first embodiment, the sub bit lines 1 to 6 are arranged on the subarrays 1 to 6 respectively, as shown in FIG. 3. The sub bit lines 1 to 6 are connected with n-channel transistors 20a to 20f for connecting the sub bit lines 1 to 6 to the common main bit line respectively. The n-channel transistors 20a to 20f are examples of the "third transistor" in the present invention. Signal lines ASS1 to ASS6 are connected to the gates of the n-channel transistors 20a to 20f respectively. The plurality of word lines WL are arranged on the subarrays 1 to 6 to intersect with the sub bit lines 1 to 6 respectively. Ferroelectric capacitors 21 are connected to the regions where the sub bit lines 1 to 6 and the word lines WL intersect with each other respectively. Thus, the crosspoint ferroelectric memory has memory cells each constituted of one ferroelectric capacitor 21.

According to the first embodiment, n-channel transistors 22a to 22e for connecting the sub bit lines 1 to 6 with each other are provided between the sub bit lines 1 to 6 respectively. The n-channel transistors 22a to 22e are examples of the "first transistor" in the present invention. Signal lines SB1 to SB5 are connected to the gates of the n-channel transistors 22a to 22e respectively. N-channel transistors 23a and 23b for connecting nonselected sub bit lines 1, 2 and 4 to 6 included in the sub bit lines 1 to 6 to the ground potential (fixed potential) are arranged on both ends of the memory cell array 1 constituted of the subarrays 1 to 6. The n-channel transistors 23a and 23b are examples of the "second transistors" in the present invention. Signal lines SB0 and SB6 are connected to the gates of the n-channel transistors 23a and 23b respectively. The n-channel transistor 23a has a first source/drain region connected to the sub bit line 1 and a second source/drain region connected to a ground wire (GND wire) 24a. The n-channel transistor 23b has a first source/drain connected to the sub bit line 6 and a second source/drain region connected to another ground wire (GND wire) 24b.

The sense amplifier 2 and a precharge portion 25 are connected to the main bit line. The precharge portion 25 is constituted of an n-channel transistor 25a connected between a reference bit line and the ground potential and another n-channel transistor 25b connected between the main bit line and the ground potential. A signal line PC1 is connected to the gates of the n-channel transistors 25a and 25b.

The sense amplifier 2 is formed by cross-coupling inputs and outputs of two CMOS inverter circuits 26 and 27 with each other. The CMOS inverter circuit 26 is constituted of a p-channel transistor 26a and an n-channel transistor 26b, while the CMOS inverter circuit 27 is constituted of a p-channel transistor 27a and an n-channel transistor 27b. A power supply potential (Vcc) is connected to first source/drain regions of the p-channel transistors 26a and 27a through a p-channel transistor 28. First source/drain regions of the n-channel transistors 26b and 27b are grounded through an n-channel transistor 29. Signal lines /SE and SE are connected to the gates of the p-channel transistor 28 and the n-channel transistor 29 respectively.

Figure 5:
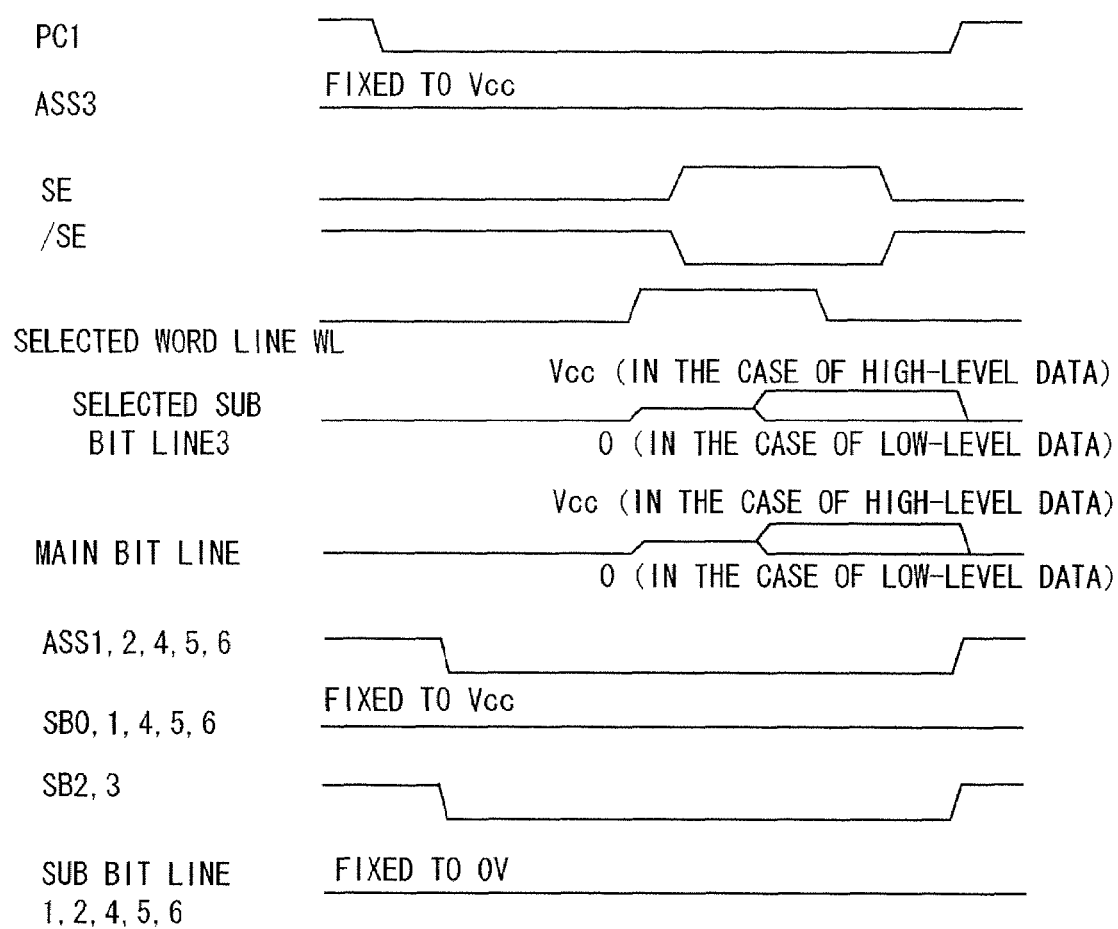
FIG. 5 is a timing chart for illustrating operations of the crosspoint ferroelectric memory according to the first embodiment of the present invention.

FIG. 5 is a timing chart for illustrating operations of the ferroelectric memory according to the first embodiment of the present invention. A standby time, a setup for a read operation, the read operation and an operation of rewriting read data in the ferroelectric memory according to the first embodiment are now described with reference to FIGS. 1 to 5.

In the following description, it is assumed that the subarray 3 is selected from among the subarrays 1 to 6.

(Standby Time)

In the standby time, all signal lines ASS1 to ASS6 are held at a step-up potential Vcc+α (α>threshold voltage Vth of n-channel transistors 20*a* to 20*f*), as shown in FIG. 5. The step-up potential Vcc+α is applied to the signal lines ASS1 to ASS6, in order to prevent a threshold voltage drop (potential reduction by the threshold voltage Vth) resulting from the n-channel transistors 20*a* to 20*f* in the rewrite operation described later. Thus, the n-channel transistors 20*a* to 20*f* connecting the sub bit lines 1 to 6 and the main bit line with each other enter ON-states, thereby connecting the sub bit lines 1 to 6 and the main bit line with each other. Further, all signal lines SB1 to SB5 are held at Vcc. Thus, the n-channel transistors 22*a* to 22*e* arranged between the sub bit lines 1 to 6 enter ON-states, thereby connecting all sub bit lines 1 to 6 with each other. The signal lines PC1, SB0 and SB6 are also held at Vcc. Thus, the n-channel transistors 25*a* and 25*b* of the precharge portion 25 enter ON-states while the n-channel transistors 23*a* and 23*b* for connecting the nonselected sub bit lines 1, 2 and 4 to 6 to the ground wires 24*a* and 24*b* also enter ON-states, thereby precharging (grounding) the main bit line and the sub bit lines 1 to 6 to the ground potential (0 V).

(Setup for Read Operation)

When the ferroelectric memory is accessed, the potential of the signal line PC1 is stepped down to 0 V, while the potentials of the signal lines ASS1, ASS2 and ASS4 to ASS6 of the nonselected subarrays 1, 2 and 4 to 6 are also stepped down from Vcc to 0 V. Thus, the n-channel transistors 20*a*, 20*b* and 20*d* to 20*f* of the nonselected sub bit lines 1, 2 and 4 to 6 enter OFF-states, thereby cutting off the nonselected sub bit lines 1, 2 and 4 to 6 from the main bit line. The signal line ASS3 of the selected subarray 3 is held at Vcc for keeping the n-channel transistor 20*c* in an ON-state, thereby keeping connection between the main bit line and the sub bit line 3. The potentials of the signal lines SB2 and SB3 for the n-channel transistors 22*b* and 22*c* provided on both ends of the selected sub bit line 3 are stepped down from Vcc to 0 V, thereby turning off the n-channel transistor 22*b* connecting the sub bit lines 2 and 3 with each other and the n-channel transistor 22*c* connecting the sub bit lines 3 and 4 with each other respectively. Thus, the selected sub bit line 3 is electrically separated from the remaining nonselected sub bit lines 1, 2 and 4 to 6. Therefore, the selected sub bit line 3 and the main bit line enter floating states at 0 V. On the other hand, the signal lines SB1, SB4 and SB5 for the n-channel transistors 22*a*, 22*d* and 22*e* are held at Vcc. Thus, the nonselected sub bit lines 1 and 2 remain connected with each other, while the nonselected sub bit lines 4 to 6 also remain connected with each other. The signal lines SB0 and SB6 for the n-channel transistors 23*a* and 23*b* positioned on both ends of the memory cell array 1 are also held at Vcc. Thus, the n-channel transistors 23*a* and 23*b* are held in ON-states, thereby holding the nonselected sub bit lines 1, 2 and 4 to 6 in the grounded states. Therefore, the nonselected sub bit lines 1, 2 and 4 to 6 are held in the states fixed to 0 V.

(Read Operation)

In the read operation, the potential of a selected word line WL of the selected subarray 3 is stepped up from 0 V to Vcc. Thus, a potential (read-voltage) corresponding to data (low- or high-level data) written in a selected ferroelectric capacitor 21 appears on the selected sub bit line 3, and is transmitted to the main bit line. When the read voltage transmitted to the main bit line is further transmitted to the sense amplifier 2, the potential of the signal line SE is stepped up from 0 V to Vcc while the potential of the signal line /SE is stepped down from Vcc to 0 V. Thus, the p-channel transistor 28 of the sense amplifier 2 enters an ON-state, thereby supplying the voltage Vcc. The n-channel transistor 29 also enters an ON-state, thereby supplying the ground potential (0 V). Thus, the sense amplifier 2 is activated. The reference bit line is supplied with a reference voltage generated in a reference voltage generation circuit (not shown). Consequently, the sense amplifier 2 differentially amplifies the voltage of the main bit line and the reference voltage, for reading the data from the memory cell formed by the selected ferroelectric capacitor 21.

(Rewrite Operation of Read Data)

Thereafter the read data is rewritten in the memory cell formed by the selected ferroelectric capacitor 21. In order to rewrite low-level data, the potential of the main bit line is set to 0 V thereby setting the potentials of the selected sub bit line 3 and the selected word line WL to 0 V and Vcc respectively. Thus, the low-level data is rewritten in the selected ferroelectric capacitor 21. Thereafter the potential of the selected word line WL is stepped down from Vcc to 0 V. In order to rewrite high-level data, on the other hand, the potential of the main bit line is set to Vcc thereby setting the potentials of the selected sub bit line 3 and the selected word line WL to Vcc and 0 V respectively. Thus, the high-level data is rewritten in the selected ferroelectric capacitor 21. In order to transmit the potential Vcc of the main bit line to the selected sub bit line 3 with no threshold voltage drop, the step-up potential Vcc+α (α>threshold voltage Vth of n-channel transistors 20*a* to 20*f*) is applied to the gate of the n-channel transistor 20*c* through the signal line ASS3. Thereafter the potential of the signal line SE is stepped down from Vcc to 0 V, while that of the signal line /SE is stepped up from 0 V to Vcc. Further, the potential of the signal line PC1 is stepped up from 0 V to Vcc. In addition, the potentials of the signal lines ASS1, ASS2, ASS4 to ASS6, SB3 and SB3 are stepped up to Vcc. Thus, the ferroelectric memory returns to the standby state.

According to the first embodiment, as hereinabove described, the ferroelectric memory is provided with the n-channel transistors 22*a* to 22*e* connecting the sub bit lines 1 to 6 with each other and so formed as to connect the sub bit lines 1 and 2 and 4 to 6 of the nonselected subarrays 1, 2 and 4 to 6 with each other through the n-channel transistors 22*a*, 22*d* and 22*e* respectively in the read operation, whereby the nonselected sub bit lines 1, 2 and 4 to 6 can be connected to the ground potential on both ends of the memory cell array 1. Thus, the nonselected sub bit lines 1, 2 and 4 to 6 can be prevented from entering floating states. Consequently, the sub bit lines 1 to 6 can be prevented from propagation of noise, whereby disturbance can be suppressed. Further, the ground wires 24*a* and 24*b* are so arranged on both ends of the memory cell array 1 that only two fixed potentials (ground wires 24*a* and 24*b*) may be employed also when the number of the subarrays is increased, whereby the memory cell array 1 including the plurality of subarrays can be inhibited from increase of the chip area.

According to the first embodiment, as hereinabove described, the ferroelectric memory is provided with the n-channel transistors 23*a* and 23*b* arranged on both ends of the memory cell array 1 for connecting the nonselected sub bit lines 1, 2 and 4 to 6 to the ground wires 24*a* and 24*b* so that the sub bit lines 1, 2 and 4 to 6 of the nonselected subarrays 1, 2 and 4 to 6 connected with each other by the n-channel transistors 22*a*, 22*d* and 22*e* are connected to the ground wires 24*a* and 24*b* through the n-channel transistors 23*a* and 23*b*, whereby the sub bit lines 1, 2 and 4 to 6 of the plurality of nonselected subarrays 1, 2 and 4 to 6 can be easily grounded on both ends of the memory cell array 1.

According to the first embodiment, as hereinabove described, the n-channel transistors 22*b* an 22*c* positioned on both ends of the sub bit line 3 of the selected subarray 3 enter OFF-states while the n-channel transistors 22a, 22d and 22e positioned between the nonselected sub bit lines 1, 2 and 4 to 6 enter ON-states in the read operation, whereby the nonselected sub bit lines 1, 2 and 4 to 6 can be connected to the ground wires 24a and 24b provided on both ends of the memory cell array 1 through the n-channel transistors 22a, 22d and 22e while electrically separating the selected sub bit line 3 from the nonselected sub bit lines 1, 2 and 4 to 6.

Second Embodiment

Referring to FIGS. 6 to 11, a crosspoint ferroelectric memory according to a second embodiment of the present invention generates a reference voltage Vref through nonselected subarrays, dissimilarly to the aforementioned first embodiment.

Figure 6:
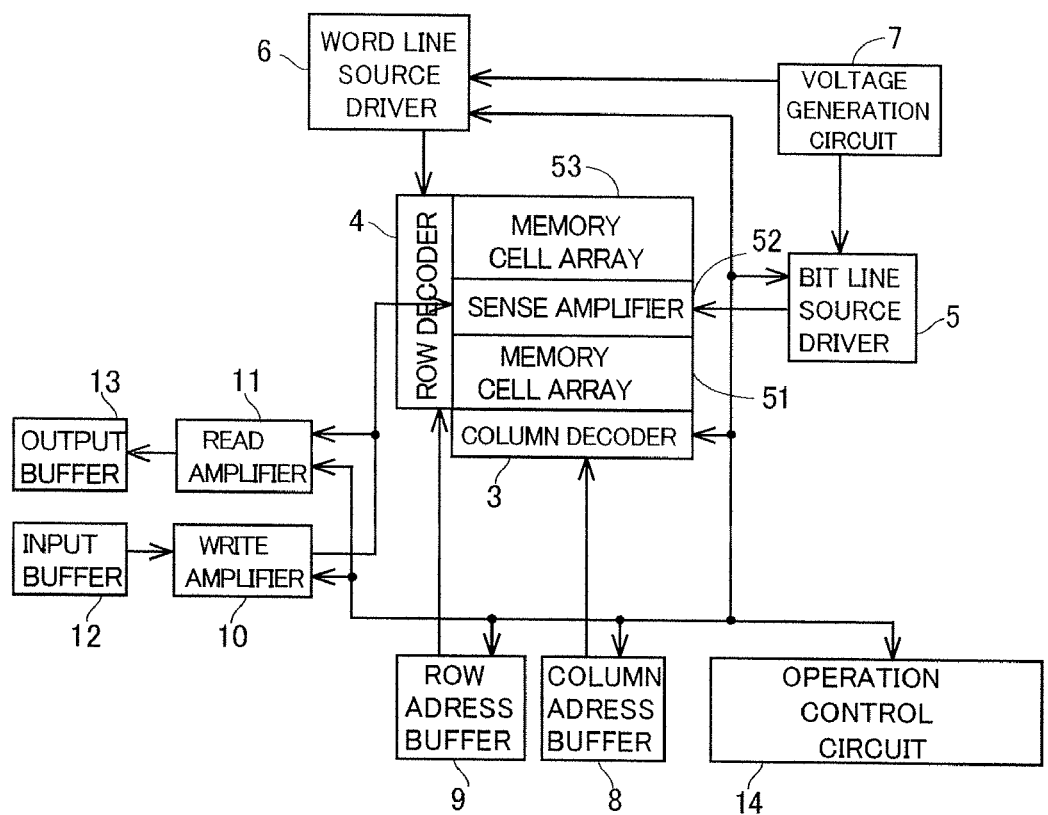
FIG. 6 is a block diagram for illustrating the overall structure of a crosspoint ferroelectric memory according to a second embodiment of the present invention.

The crosspoint ferroelectric memory according to the second embodiment comprises memory cell arrays 51 and 53, a sense amplifier 52, a column decoder 3, a row decoder 4, a bit line source driver 5, a word line source driver 6, a voltage generation circuit 7, a column address buffer 8, a row address buffer 9, a write amplifier 10, a read amplifier 11, an input buffer 12, an output buffer 13 and an operation control circuit 14, as shown in FIG. 6. The elements from the column decoder 3 up to the operation control circuit 14 are identical in structure to those in the first embodiment.

Figure 7:
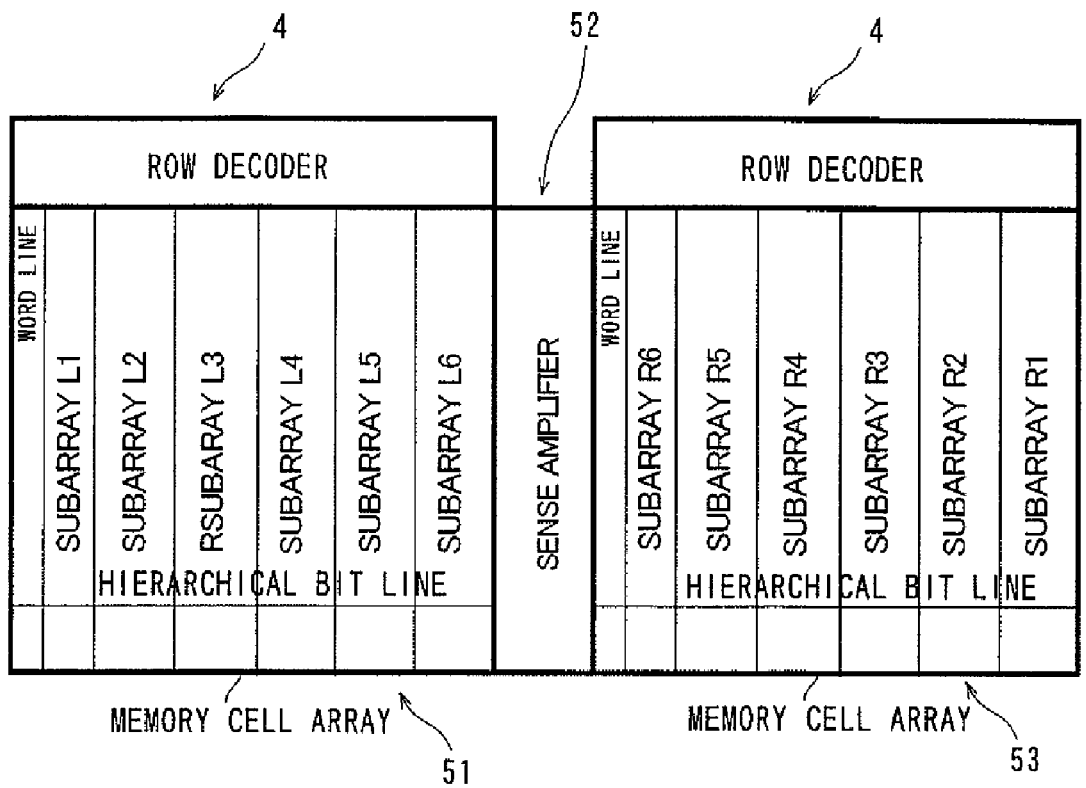
FIG. 7 is a schematic diagram showing the internal structures of memory cell arrays of the crosspoint ferroelectric memory according to the second embodiment shown in FIG. 6.

According to the second embodiment, the memory cell arrays 51 and 53 are divided into six subarrays L1 to L6 and six subarrays R1 to R6 respectively, as shown in FIG. 7. A plurality of word lines WL and a plurality of hierarchical bit lines are arranged on the subarrays L1 to L6 and R1 to R6 to intersect with each other. The hierarchical bit lines include a common main bit line MBL (/MBL) and sub bit lines L1 to L6 (R1 to R6) arranged for the respective subarrays L1 to L6 (R1 to R6). The common sense amplifier 52 and a common precharge portion 65 are connected to the memory cell arrays 51 and 53. Thus, the left and right memory cell arrays 51 and 53 share the sense amplifier 52. The column decoder 3 is positioned adjacently to the memory cell array 51.

Figure 11:
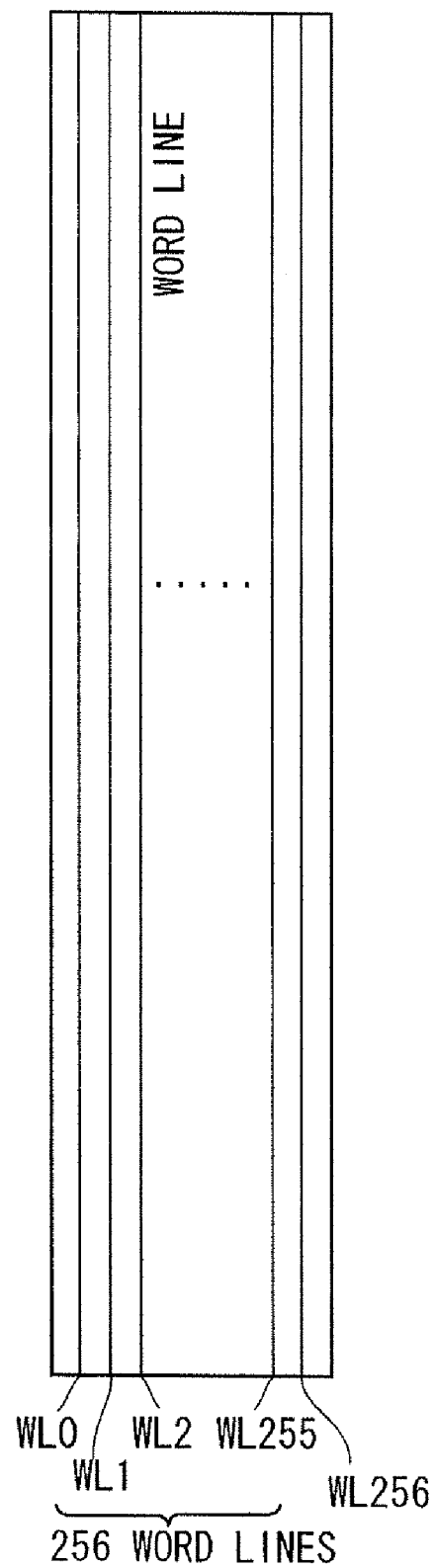
FIG. 11 is a schematic diagram showing the arrangement of word lines in each subarray of the crosspoint ferroelectric memory according to the second embodiment of the present invention.

According to the second embodiment, each of the subarrays L1 to L6 and R1 to R6 includes 256 word lines WL0 to WL255 for data storage and a reference word line WL256 for generating the reference voltage Vref, as shown in FIG. 11.

Figure 8:
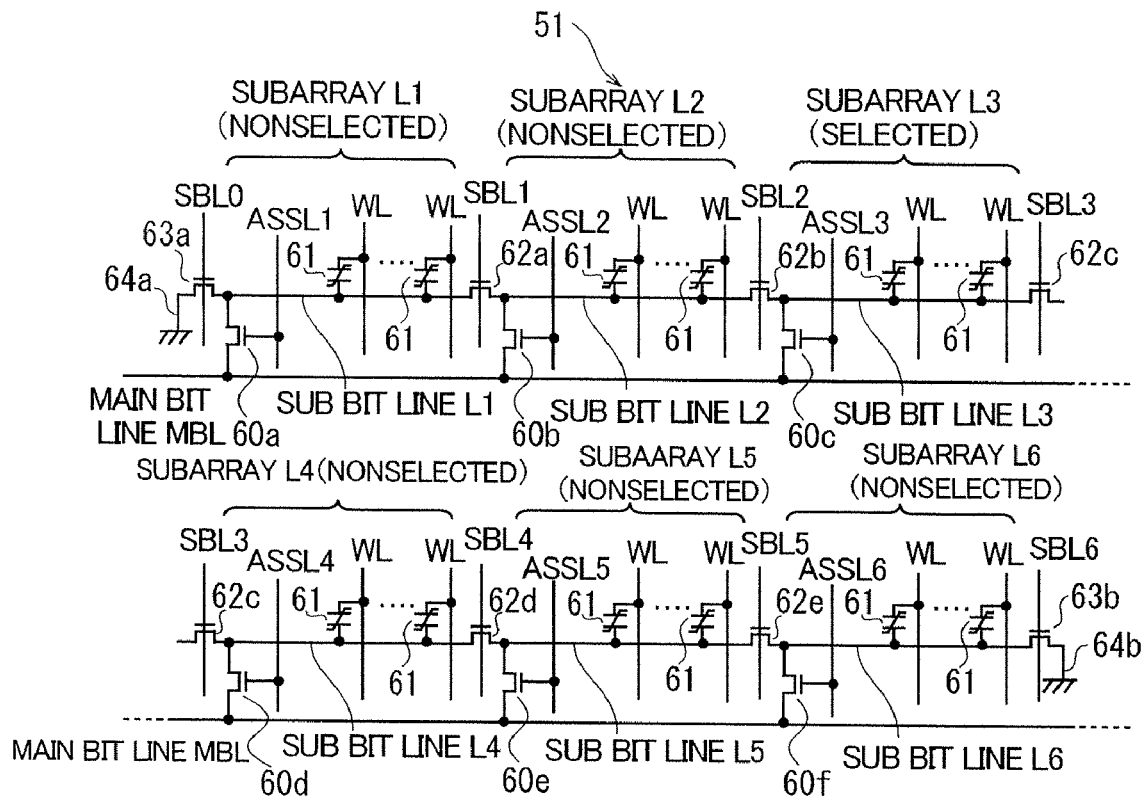
FIG. 8 is a circuit diagram detailedly showing the internal structure of a selected memory cell array of the crosspoint ferroelectric memory according to the second embodiment of the present invention.
Figure 8:
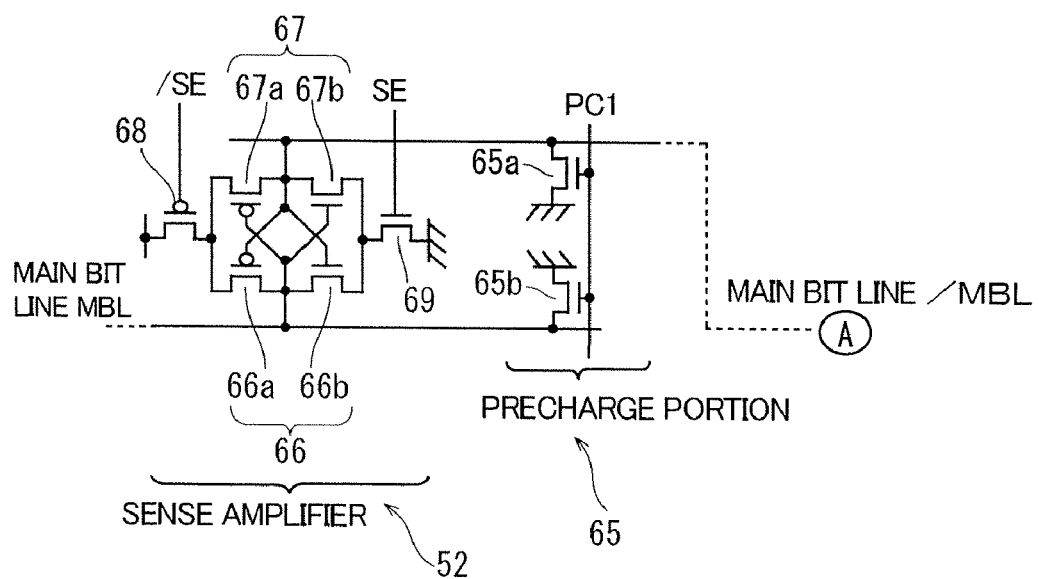

According to the second embodiment, the sub bit lines L1 to L6 are arranged on the subarrays L1 to L6 of the memory cell array 51 respectively, as shown in FIG. 8. The sub bit lines L1 to L6 are connected with n-channel transistors 60a to 60f for connecting the sub bit lines L1 to L6 to the common main bit line MBL respectively. The n-channel transistors 60a to 60f are examples of the "third transistor" in the present invention. Signal lines ASSL1 to ASSL6 are connected to the gates of the n-channel transistors 60a to 60f respectively. The plurality of word lines WL are arranged on the subarrays L1 to L6 to intersect with the sub bit lines L1 to L6 respectively. Ferroelectric capacitors 61 are connected to the regions where the sub bit lines L1 to L6 and the word lines WL intersect with each other respectively. Thus, the crosspoint ferroelectric memory has memory cells each constituted of one ferroelectric capacitor 61.

According to the second embodiment, n-channel transistors 62a to 62e for connecting the sub bit lines L1 to L6 with each other are provided between the sub bit lines L1 to L6 respectively. The n-channel transistors 62a to 62e are examples of the "first transistor" in the present invention. Signal lines SBL1 to SBL5 are connected to the gates of the n-channel transistors 62a to 62e respectively. N-channel transistors 63a and 63b for connecting nonselected sub bit lines L1, L2 and L4 to L6 included in the sub bit lines L1 to L6 to the ground potential (fixed potential) are arranged on both ends of the memory cell array 51 constituted of the subarrays L1 to L6. The n-channel transistors 63a and 63b are examples of the "second transistors" in the present invention. Signal lines SBL0 and SBL6 are connected to the gates of the n-channel transistors 63a and 63b respectively. The n-channel transistor 63a has a first source/drain region connected to the sub bit line L1 and a second source/drain region connected to a ground wire (GND wire) 64a. The n-channel transistor 63b has a first source/drain region connected to the sub bit line L6 and a second source/drain region connected to another ground wire (GND wire) 64b.

The sense amplifier 52 and the precharge portion 65 are connected to the main bit line MBL. The precharge portion 65 is constituted of an n-channel transistor 65a connected between the main bit line /MBL and the ground potential and another n-channel transistor 65b connected between the main bit line MBL and the ground potential. A signal line PC1 is connected to the gates of the n-channel transistors 65a and 65b.

The sense amplifier 52 is formed by cross-coupling inputs and outputs of two CMOS inverter circuits 66 and 67 with each other. The CMOS inverter circuit 66 is constituted of a p-channel transistor 66a and an n-channel transistor 66b, while the CMOS inverter circuit 67 is constituted of a p-channel transistor 67a and an n-channel transistor 67b. A power supply potential (Vcc) is connected to first source/drain regions of the p-channel transistors 66a and 67a through a p-channel transistor 68. First source/drain regions of the n-channel transistors 66b and 67b are grounded through an n-channel transistor 69. Signal lines /SE and SE are connected to the gates of the p-channel transistor 68 and the n-channel transistor 69 respectively.

Figure 9:
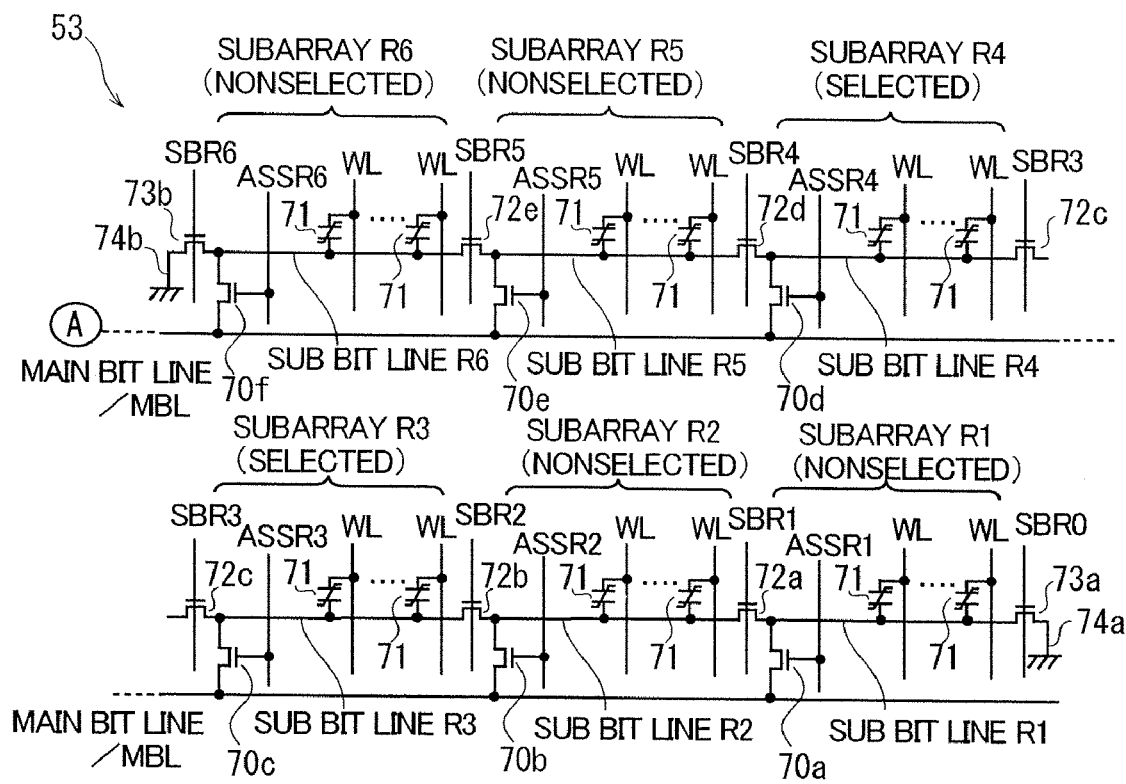
FIG. 9 is a circuit diagram detailedly showing the internal structure of a nonselected memory cell array of the crosspoint ferroelectric memory according to the second embodiment of the present invention.
Figure 10:
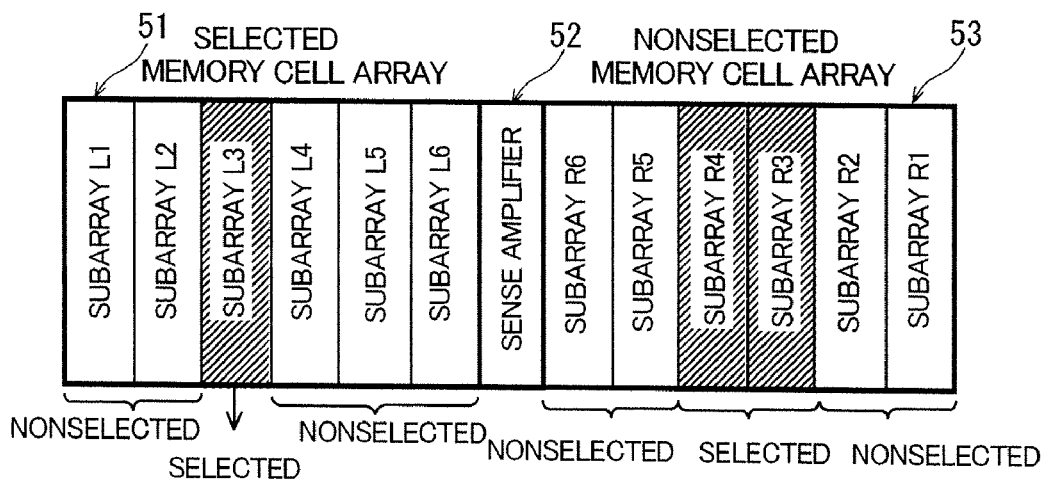
FIG. 10 is a schematic diagram illustrating selected and nonselected subarrays shown in FIGS. 8 and 9.

According to the second embodiment, sub bit lines R1 to R6 are arranged on the subarrays R1 to R6 of the memory cell array 53 respectively, as shown in FIG. 9. The sub bit lines R1 to R6 are connected with n-channel transistors 70a to 70f for connecting the sub bit lines R1 to R5 to the common main bit line /MBL respectively. The n-channel transistors 70a to 70f are examples of the "third transistor" in the present invention. Signal lines ASSR1 to ASSR6 are connected to the gates of the n-channel transistors 70a to 70f respectively. The plurality of word lines WL are arranged on the subarrays R1 to R6 to intersect with the sub bit lines 1 to 6 respectively. Ferroelectric capacitors 71 are connected to the regions where the sub bit lines R1 to R6 and the word lines WL intersect with each other respectively. Thus, the crosspoint ferroelectric memory has memory cells each constituted of one ferroelectric capacitor 71.

According to the second embodiment, n-channel transistors 72a to 72e for connecting the sub bit lines R1 to R6 with each other are provided between the sub bit lines R1 to R6 respectively. The n-channel transistors 72a to 72e are examples of the "first transistor" in the present invention. Signal lines SBR1 to SBR5 are connected to the gates of the n-channel transistors 72a to 72e respectively. N-channel transistors 73a and 73b for connecting the sub bit lines R1, R2, R5 and R6 to the ground potential (fixed potential) are arranged on both sides of the memory cell array 53 constituted of the subarrays R1 to R6. The n-channel transistors 73a and 73b are examples of the "second transistors" in the present invention. Signal lines SBR0 and SBR6 are connected to the gates of the n-channel transistors 73a and 73b respectively. The n-channel transistor 73a has a first source/drain region connected to the sub bit line R1 and a second source/drain region connected to a ground wire (GND wire) 74a. The n-channel transistor 73b has a first source/drain region connected to the sub bit line R6 and a second source/drain region connected to another ground wire (GND wire) 74b.

Figure 12:
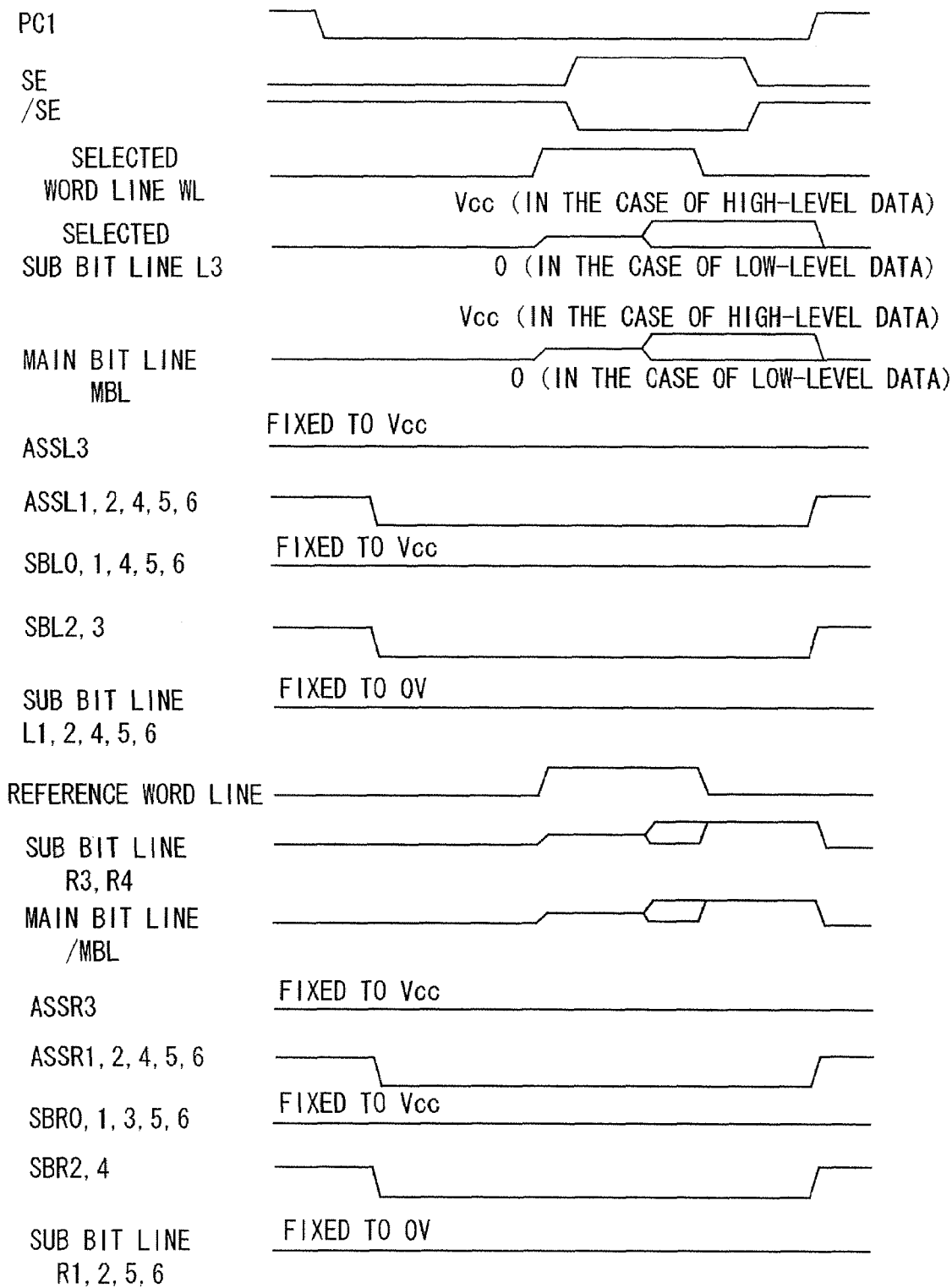
FIG. 12 is a timing chart for illustrating operations of the crosspoint ferroelectric memory according to the second embodiment of the present invention.

FIG. 12 is a timing chart for illustrating operations of the ferroelectric memory according to the second embodiment of the present invention. A standby time, a setup for a read operation, the read operation and an operation of rewriting read data in the ferroelectric memory according to the second embodiment are now described with reference to FIGS. 6 to 12. In the following description, it is assumed that the memory cell array 51 is selected while the memory cell array 53 is not selected. It is also assumed that the subarray L3 is selected from among the subarrays L1 to L6 of the selected memory cell array 51, while the subarrays R3 and R4 are selected from among the subarrays R1 to R6 of the nonselected memory cell array 53 for generating the reference voltage Vref.

(Standby Time)

In the standby time, all signal lines ASSL1 to ASSL6 of the selected memory cell array 51 are held at a step-up potential Vcc+α (α>threshold voltage Vth of n-channel transistors 60a to 60f), as shown in FIG. 12. Thus, the n-channel transistors 60a to 60f connecting the sub bit lines L1 to L6 and the main bit line MBL with each other enter ON-states, thereby connecting the sub bit lines L1 to L6 and the main bit line MBL with each other. Further, all signal lines SBL1 to SBL5 are held at Vcc. Thus, the n-channel transistors 62a to 62e arranged between the sub bit lines L1 to L6 enter ON-states, thereby connecting all sub bit lines L1 to L6 with each other. The signal lines PC1, SBL0 and SBL6 are also held at Vcc. Thus, the n-channel transistors 65a and 65b of the precharge portion 65 enter ON-states while the n-channel transistors 63a and 63b for connecting the nonselected sub bit lines L1, L2 and L4 to L6 to the ground wires 64a and 64b also enter ON-states, thereby precharging (grounding) the main bit line MBL and the sub bit lines L1 to L6 to the ground potential (0 V).

Further, all signal lines ASSR1 to ASSR6 of the nonselected memory cell array 53 are held at the step-up potential Vcc+α (α>threshold voltage Vth of n-channel transistors 70a to 70f). Thus, the n-channel transistors 70a to 70f connecting the sub bit lines R1 to R6 and the main bit line /MBL with each other enter ON-states, thereby connecting the sub bit lines R1 to R6 and the main bit line /MBL with each other. Further, all signal lines SBR1 to SBR5 are held at Vcc. Thus, the n-channel transistors 72a to 72e arranged between the sub bit lines R1 to R6 enter ON-states, thereby connecting all sub bit lines R1 to R6 with each other. The signal lines PC1, SBR0 and SBR6 are also held at Vcc. Thus, the n-channel transistors 65a and 65b of the precharge portion 65 enter ON-states while the n-channel transistors 73a and 73b for connecting the sub bit lines R1, R2, R5 and R6 to the ground wires 74a and 74b also enter ON-states, thereby precharging (grounding) the main bit line /MBL and the sub bit lines R1 to R6 to the ground potential (0 V).

(Setup for Read Operation)

When the ferroelectric memory is accessed, the potential of the signal line PC1 is stepped down to 0 V, while the potentials of the signal lines ASSL1, ASSL2 and ASSL4 to ASSL6 of the nonselected subarrays L1, L2 and L4 to L6 are also stepped down from Vcc to 0 V in the selected memory cell array 51. Thus, the n-channel transistors 60a, 60b and 60d to 60f of the nonselected sub bit lines L1, L2 and L4 to L6 enter OFF-states, thereby cutting off the nonselected sub bit lines L1, L2 and L4 to L6 from the main bit line MBL. The signal line ASSL3 of the selected subarray L3 of the selected memory cell array 51 is held at Vcc for keeping the n-channel transistor 60c in an ON-state, thereby keeping connection between the main bit line MBL and the sub bit line L3. The potentials of the signal lines SBL2 and SBL3 for the n-channel transistors 62b and 62c provided on both ends of the selected sub bit line L3 are stepped down from Vcc to 0 V, thereby turning off the n-channel transistor 62b connecting the sub bit lines L2 and L3 with each other and the n-channel transistor 62c connecting the sub bit lines L3 and L4 with each other respectively. Thus, the selected sub bit line L3 is electrically separated from the remaining nonselected sub bit lines L1, L2 and L4 to L6. Therefore, the selected sub bit line L3 and the main bit line MBL enter floating states at 0 V. On the other hand, the signal lines SBL1, SBL4 and SBL5 for the n-channel transistors 62a, 62d and 62e are held at Vcc. Thus, the nonselected sub bit lines L1 and L2 remain connected with each other, while the nonselected sub bit lines L4 to L6 also remain connected with each other. The signal lines SBL0 and SBL6 for the n-channel transistors 63a and 63b positioned on both ends of the memory cell array 51 are also held at Vcc. Thus, the n-channel transistors 63a and 63b are held in ON-states, thereby holding the nonselected sub bit lines L1, L2 and L4 to L6 in the grounded states. Therefore, the nonselected sub bit lines L1, L2 and L4 to L6 are held in the states fixed to 0 V.

In the nonselected memory cell array 53, on the other hand, the potentials of the signal lines ASSR1, ASSR2 and ASSR4 to ASSR6 of the subarrays R1, R2 and R4 to R6 are stepped down from Vcc to 0 V. Thus, the n-channel transistors 70a, 70b and 70d to 70f for the sub bit lines R1, R2 and R4 to R6 enter OFF-states, thereby cutting off the sub bit lines R1, R2 and R4 to R6 from the main bit line /MBL. The signal line ASSR3 of the subarray R3 of the nonselected memory cell array 53 corresponding to the selected subarray L3 of the selected memory cell array 51 is held at Vcc for keeping the n-channel transistor 70c in an ON-state, thereby keeping connection between the main bit line /MBL and the sub bit line R3. The potentials of the signal lines SBR2 and SBR3 for the n-channel transistors 72b and 72c provided on both ends of the sub bit lines R3 and R4 are stepped down from Vcc to 0 V respectively, thereby turning off the n-channel transistor 72b connecting the sub bit lines R2 and R3 with each other and the n-channel transistor 72d connecting the sub bit lines R4 and R5 with each other respectively. Thus, the sub bit lines R3 and R4 are electrically separated from the remaining sub bit lines R1, R2, R5 and R6 in a state connected with each other. Therefore, the sub bit lines R3 and R4 and the main bit line /MBL enter floating states at 0 V. On the other hand, the signal lines SBR1 and SBR5 for the n-channel transistors 72a and 72e are held at Vcc. Thus, the sub bit lines R1 and R2 remain connected with each other, while the sub bit lines R5 and R6 also remain connected with each other. The signal lines SBR0 and SBR6 for the n-channel transistors 73a and 73b positioned on both ends of the memory cell array 53 are also held at Vcc. Thus, the n-channel transistors 73a and 73b are held in ON-states, thereby holding the sub bit lines R1, R2, R5 and R6 in the grounded states. Therefore, the sub bit lines R1, R2, R5 and R6 are held in the states fixed to 0 V.

(Read Operation)

In the read operation, the potential of a selected word line WL of the selected subarray L3 is stepped up from 0 V to Vcc in the selected memory cell array 51. Thus, a potential (read voltage) corresponding to data (low- or high-level data) written in a selected ferroelectric capacitor 61 appears on the selected sub bit line L3, and is transmitted to the main bit line MBL. In this case, the read voltage output from the ferroelectric capacitor 61 to the main bit line MBL is expressed by either one of the following formulas (1) and (2):

$$Vsig1 = Vcc \times Cs1/(Cmb+Csb+Cs1) \quad (1)$$

$$Vsig0 = Vcc \times Cs0/(Cmb+Csb+Cs0) \quad (2)$$

The above formula (1) expresses the read voltage in the case where high-level data is written in the ferroelectric capacitor 61 constituting a selected memory cell of the ferroelectric memory, while the above formula (1) expresses the read voltage in the case where low-level data is written in the ferroelectric capacitor 61 constituting the selected memory cell of the ferroelectric memory. In the above formulas (1) and (2), Cs1 represents the capacitance of the memory cell storing the high-level data, Cs0 represents the capacitance of the memory cell storing the low-level data, Cmb represents the parasitic capacitance of the main bit line MBL and Csb represents the parasitic capacitance of the sub bit line L3.

In the nonselected memory cell array 53, on the other hand, the potential of the reference word line (WL256 in FIG. 11), connected to a reference voltage generation cell, of the subarray R3 corresponding to the selected subarray L3 of the selected memory cell array 51 is stepped up from 0 V to Vcc. At this time, the sub bit lines R3 and R4 are connected with each other, to exhibit a sub bit line capacitance twice the parasitic capacitance Csb. It is assumed that high-level data is necessarily written in the reference voltage generation cell. In this case, a read voltage from the reference voltage generation cell is expressed as follows:

$$Vref = Vcc \times Cs1/(Cmb+2Csb+Cs1) \quad (3)$$

The above formulas (1) and (3) result in the following formula (4):

$$Vsig1-Vref = Vcc \times Cs1 \times Csb/((Cmb+Csb+Cs1)\times(Cmb+2Csb+Cs1)) \quad (4)$$

All of Vcc and the respective capacitances are at positive values, whereby the above formula (4) provides a positive value. Hence, the following formula (5) holds:

$$Vsig1 > Vref \quad (5)$$

The above formulas (2) and (3) result in the following formula (6):

$$Vref-Vsig0 = Vcc \times (Cmb \times (Cs1-Cs0)+Csb \times ((Cs1-2Cs0))/((Cmb+Csb+Cs1)\times(Cmb+2Csb+Cs1)) \quad (6)$$

The capacitance of the ferroelectric capacitor 61 storing the high-level data is greater than that of the ferroelectric capacitor 61 storing low-level data, whereby the following formula (7) holds:

$$Cs1 > Cs0 \quad (7)$$

The capacitance of the ferroelectric capacitor 61 is so set that the following formula (8) is positive:

$$Cs1 > 2Cs0 \quad (8)$$

Hence, the formula (6) provides a positive value, whereby the following formula (9) holds:

$$Vref > Vsig0 \quad (9)$$

In other words, the capacitance of the ferroelectric capacitor 61 is so set that the above formula (8) is positive, whereby the following formula (10) holds from the above formulas (5) and (9);

$$Vsig1 > Vref > Vsig0 \quad (10)$$

This read voltage Vref is output to the main bit line /MBL as the reference voltage.

When the read voltage transmitted from the selected ferroelectric capacitor 61 to the main bit line MBL is further transmitted to the sense amplifier 52, the potential of the signal line SE is stepped up from 0 V to Vcc while the potential of the signal line /SE is stepped down from Vcc to 0 V. Thus, the p-channel transistor 68 of the sense amplifier 52 enters an ON-state, thereby supplying the voltage Vcc. The n-channel transistor 69 also enters an ON-state, thereby supplying the ground potential (0 V). Thus, the sense amplifier 52 is activated. Consequently, the sense amplifier 52 differentially amplifies the potentials of the main bit lines MBL and /MBL, for reading the data from the memory cell formed by the selected ferroelectric capacitor 61. As hereinabove described, the reference voltage Vref is so set as to satisfy the relation Vsig0<Vref<Vsig1, whereby the sense amplifier 52 reliably amplifies/defines high-level data when reading the high-level data while amplifying/defining low-level data when reading the low-level data.

(Rewrite Operation of Read Data)

Thereafter the read data is rewritten in the memory cell formed by the selected ferroelectric capacitor 61. In order to rewrite low-level data, the potential of the main bit line MBL is set to 0 V thereby setting the potentials of the selected sub bit line L3 and the selected word line WL to 0 V and Vcc respectively. Thus, the low-level data is rewritten in the selected ferroelectric capacitor 61. Thereafter the potential of the selected word line WL is stepped down from Vcc to 0 V. In order to rewrite high-level data, on the other hand, the potential of the main bit line MBL is set to Vcc thereby setting the potentials of the selected sub bit line L3 and the selected word line WL to Vcc and 0 V respectively. Thus, the high-level data is rewritten in the selected ferroelectric capacitor 61. Thereafter the potential of the signal line SE is stepped down from Vcc to 0 V, while that of the signal line /SE is stepped up from 0 V to Vcc. Further, the potential of the signal line PC1 is stepped up from 0 V to Vcc. In addition, the potentials of the signal lines ASSL1, ASSL2, ASSL4 to ASSL6, SBL2 and SBL3 are stepped up to Vcc. Further, the potentials of the signal lines ASSR1, ASSR2, ASSR4 to ASSR6, SBR2 and SBR4 are also stepped up to Vcc. Thus, the ferroelectric memory returns to the standby state.

As to rewriting in the reference voltage generation cell, on the other hand, the potentials of the main bit line /MBL and the reference word line WL256 are set to Vcc and 0 V respectively through means (not shown) supplying Vcc to the main bit line /MBL. Thus, high-level data is necessarily rewritten in the reference voltage generation cell.

According to the second embodiment, as hereinabove described, the reference voltage word line WL256, connected with the memory cell storing high-level data, for generating the reference voltage Vref is provided on each of the subarrays L1 to L6 and R1 to R6 of the memory cell arrays 51 and 53 and the two sub bit lines R3 and R4 of the nonselected memory cell array 53 are connected with each other through the n-channel transistor 72c in the read operation, whereby the reference voltage word line WL256 for the sub bit line R3 storing high-level data can supply the reference voltage Vref to the main bit line /MBL. Thus, the reference voltage Vref can be generated through the two sub bit lines R3 and R4 of the nonselected memory cell array 53, to require no additional reference voltage generation circuit. Therefore, the ferroelectric memory can be further inhibited from increase of the chip area. Further, the sub bit line R3 of the nonselected memory cell array 53 corresponding to the selected sub bit line L3 of the selected memory cell array 51 is employed as the sub bit line for generating the reference voltage Vref, whereby the sub bit line for generating the reference voltage Vref can be varied every access. Thus, the ferroelectric memory can be inhibited from intensively using a specific sub bit line for generating the reference voltage Vref, thereby suppressing deterioration of the sub bit line for generating the reference voltage Vref.

The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each memory cell array is divided into six subarrays in each of the aforementioned embodiments, the present invention is not restricted to this but each memory cell array may alternatively be divided into two or more subarrays.

While the transistors for connecting the main bit line(s) and the sub bit lines with each other, those for connecting the sub bit lines with each other and those for connecting the sub bit lines to the ground wires are formed by n-channel transistors in each of the aforementioned embodiments, the present invention is not restricted to this but these transistors may alternatively be formed by p-channel transistors.

While the sub bit lines R3 and R4 of the nonselected memory cell array 53 are used for generating the reference voltage Vref in the aforementioned second embodiment, the present invention is not restricted to this but the sub bit lines R2 and R3 may alternatively be used for generating the reference voltage Vref.

While the two sub bit lines R3 and R4 are selected for generating the reference voltage Vref in the aforementioned second embodiment, the present invention is not restricted to this but three or more sub bit lines may alternatively be selected for generating the reference voltage Vref.

While each of the aforementioned embodiments is applied to the read operation, the present invention is not restricted to this but is also applicable to a write operation and a rewrite operation.

What is claimed is:

1. A memory comprising:
   a memory cell array including a plurality of subarrays;
   a word line arranged on said memory cell array;
   a main bit line arranged to intersect with said word line;
   sub bit lines arranged on respective said subarrays and provided to be connectable to said main bit line;
   a storage portion connected between said word line and said sub bit lines; and
   a first transistor arranged between respective said sub bit lines for connecting said respective sub bit lines with each other;
   wherein nonselected said subarrays include a first subarray having a first sub bit line and a second subarray having a second sub bit line, said first and second subarrays being adjacent and separate from each other, said first sub bit line of said first subarray and said second sub bit line of said second subarray connected through said first transistor to fixed potentials arranged on both ends of said memory cell array.

2. A memory comprising:
   a memory cell array including a plurality of subarrays;
   a word line arranged on said memory cell array;
   a main bit line arranged to intersect with said word line;
   sub bit lines arranged on respective said subarrays and provided to be connectable to said main bit line;
   a storage portion connected between said word line and said sub bit lines; and
   a first transistor arranged between respective said sub bit lines for connecting said respective sub bit lines with each other;
   for connecting said sub bit lines of nonselected said subarrays with each other through said first transistor and connecting said sub bit lines to fixed potentials arranged on both ends of said memory cell array at least in a read operation; and
   further comprising second transistors arranged on both ends of said memory cell array for connecting said sub bit lines of said nonselected subarrays to said fixed potentials,
   for connecting said sub bit lines of said nonselected subarrays connected with each other by said first transistor to said fixed potentials through said second transistors in said read operation.

3. The memory according to claim 2, connecting said sub bit line of said nonselected subarray, included in said plurality of subarrays, arranged between said sub bit line of selected said subarray and one of said second transistors to said fixed potentials through said one of said second transistors while connecting said sub bit line of said nonselected subarray arranged between said sub bit line of said selected subarray and the other one of said second transistors to said fixed potentials through the other one of said second transistors.

4. The memory according to claim 1, turning off said first transistors positioned on both ends of said sub bit line of selected said subarray while turning on said first transistor positioned between nonselected said subarrays in said read operation.

5. The memory according to claim 1, further comprising a third transistor provided between said main bit line and said sub bit lines for connecting said main bit line and said sub bit lines with each other.

6. The memory according to claim 1, wherein
   said memory cell array further includes a reference bit line, and a reference voltage generation circuit is connected to said reference bit line.

7. The memory according to claim 1, wherein
   said memory cell array includes a first memory cell array including a plurality of said subarrays and a second memory cell array including a plurality of said subarrays, and
   said subarrays of said first memory cell array and said second memory cell array include reference voltage generation word lines to which memory cells storing first data are connected,
   wherein the memory generates a reference voltage to be differentially amplified with the voltage of said main bit line in said read operation by connecting a plurality of said sub bit lines of either said second memory cell array or said first memory cell array with each other by said first transistor when selecting prescribed said subarray of either said first memory cell array or said second memory cell array.

8. The memory according to claim 7, wherein
   a sense amplifier common to said first memory cell array and said second memory cell array is connected between said first memory cell array and said second memory cell array.

9. The memory according to claim 7, wherein
a precharge portion, common to said first memory cell array and said second memory cell array, for precharging said main bit line and said sub bit lines is connected between said first memory cell array and said second memory cell array.

10. The memory according to claim 7, wherein
said main bit line of either said second memory cell array or said first memory cell array serves as a reference bit line when prescribed said subarray of either said first memory cell array or said second memory cell array is selected, and
said main bit line of either said first memory cell array or said second memory cell array serves as a reference bit line when prescribed said subarray of either said second memory cell away or said first memory cell away is selected.

11. The memory according to claim 7, selecting a plurality of adjacent said subarrays of either said second memory cell away or said first memory cell away for generating said reference voltage when selecting prescribed said subarray of either said first memory cell away or said second memory cell array.

12. The memory according to claim 11, wherein
said plurality of adjacent said subarrays of either said second memory cell away or said first memory cell away selected for generating said reference voltage vary with said prescribed subarray of either said first memory cell array or said second memory cell array as selected.

13. The memory according to claim 7, wherein said reference voltage is adjusted to a value between the voltage of said first data and a voltage of second data smaller than the voltage of said first data by electrically connecting a plurality of said sub bit lines of either said second memory cell array or said first memory cell array.

14. The memory according to claim 7, wherein said first data are written in said memory cells connected to said reference voltage generation word lines when rewriting read data.

15. The memory according to claim 1, wherein
said storage portion includes a ferroelectric capacitor.

16. The memory according to claim 15, wherein
said ferroelectric capacitor is a crosspoint ferroelectric capacitor connected to said word line and said sub bit lines.

* * * * *

UNITED STATES PATENT AND TRADEMARK OFFICE
CERTIFICATE OF CORRECTION

PATENT NO. : 7,558,098 B2
APPLICATION NO. : 11/739754
DATED : July 7, 2009
INVENTOR(S) : Miyamoto It is certified that error appears in the above-identified patent and that said Letters Patent is hereby corrected as shown below:

Col. 15, line 17, "memory cell away or" should read --memory cell array or--
Col. 15, line 21, "away or said first memory cell away for" should read --array or said first memory cell array for--
Col. 15, line 23, "memory cell away or" should read --memory cell array or--
Col. 16, line 3, "cell away or said first memory cell away" should read --cell array or said first memory cell array--

Signed and Sealed this

Twenty-third Day of February, 2010

David J. Kappos
*Director of the United States Patent and Trademark Office*